United States Patent
Tojima

(10) Patent No.: US 7,062,728 B2
(45) Date of Patent: Jun. 13, 2006

(54) METHOD OF DESIGNING A LOGIC CIRCUIT UTILIZING AN ALGORITHM BASED IN C LANGUAGE

(75) Inventor: Masayoshi Tojima, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/167,579

(22) Filed: Jun. 13, 2002

(65) Prior Publication Data

US 2003/0005392 A1    Jan. 2, 2003

(30) Foreign Application Priority Data

Jun. 29, 2001  (JP) .............................. 2001-197867

(51) Int. Cl.
    *G06F 17/50*    (2006.01)
(52) U.S. Cl. .................. 716/3; 716/1; 716/4; 716/5
(58) Field of Classification Search .................... 716/3, 716/18, 2, 4, 1, 5
    See application file for complete search history.

(56) References Cited

U.S. PATENT DOCUMENTS

| | | | |
|---|---|---|---|
| 6,167,363 A | | 12/2000 | Stapleton .................... 703/14 |
| 6,226,776 B1 | * | 5/2001 | Panchul et al. ............... 716/3 |
| 6,701,501 B1 | * | 3/2004 | Waters et al. ................ 716/8 |
| 2002/0143511 A1 | * | 10/2002 | Iwamasa ...................... 703/17 |
| 2003/0135833 A1 | * | 7/2003 | Tojima et al. ................. 716/10 |
| 2003/0135834 A1 | * | 7/2003 | Tojima et al. ................. 716/10 |

FOREIGN PATENT DOCUMENTS

JP    2001-109788    4/2001

OTHER PUBLICATIONS

D. Soderman et al., Implementing C Algorithms in Reconfigurable Hardware Using C2Verilog, Proceedings of IEEE Symposium on FPGAs for Custom Computing Machines, pp. 339-342, Apr. 1998.*

D. Soderman et al., Implementing C Designs in Hardware: A Full-featured ANSI C to RTL Verilog Compiler in Action, 1998 Internation Verilog HDL Conference and VHDL Internation Users Forum, pp. 22-39, Mar. 1998.*

(Continued)

*Primary Examiner*—A. M. Thompson
(74) *Attorney, Agent, or Firm*—McDermott Will & Emery LLP

(57) ABSTRACT

An algorithm C description describing an algorithm of computation or control of a logic circuit in a C language is split into a plurality of states in units of processing, and the execution order of the split processing is described as state transition, to generate a functional C description with a control description embedded therein. A clock description as the conception of time is inserted in the functional C description, to be converted into a RT level C description. The RT level C description is converted into a RT level description in HDL with an existing conversion tool.

15 Claims, 16 Drawing Sheets

OTHER PUBLICATIONS

D. Soderman and Y. Panchul, Implementing C Designs in Hardware: A Full Featured ANSI C to RTL Verilog Compiler in Action, Proceedings of Verilog HDL Conference and VHDL International Users Forum, pp. 22-29, Mar. 1998.*

S. Jolly et al., Automated Equivalence Checking of Switch Level Circuits, Proceedings of the 2002 Design Automation Conference, pp. 299-304, Jun. 2002.*

D. Verkest et al., System Level Design Using C++, Proceedings of the 2000 Design, Automation and Test in Europe Conference, pp. 74-81, Mar. 2000.*

A. Jones et al., PACT HDL: A C Compiler Targeting ASICs and FPGAs with Power and Performance Optimizations, Proceedings of the International Conference on Compilers, Architecture, and Synthesis for Embedded Systems, pp. 188-197, Oct. 2002.*

G. Economakos et al., Behavioral Synthesis with SystemC, Proceedings of Design, Automation and Test in Europe, pp. 21-25, Mar. 2001.*

W. Mueller et al., The Formal Execution Semantics of SpecC, 15th International Symposium on System Synthesis, pp. 150-155, Oct. 2002.*

M. Fujita et al., THe Standard SpecC Language, The 14th Internation Symposium on System Synthesis, pp. 81-86, Oct. 2001.*

* cited by examiner

FIG. 4A

```
void exe(d,*p){
  int a,data;
  a= 3;
  data =d;
  a = a*data;
  a = a + 2
  *p=a;
}
```

```
void exe(d,*p)
{
  int a,data;
  do{
    switch(state){
      case INI:
        a= 3;
        data = d;
        state=EXEC;
        break;
      case EXEC:
        a = a*data;
        a = a+2;
        // 2cycle
        state=DOUT;
        break;
      case DOUT:
        *p=a;
        state=INI;
        break;
    }
  }while(state!=INI);
}
```

FIG. 5

```
blockdef exe {
 d : inslave,
 p : outmaster
 )
    .
    .
 thread rise (clk){
   switch(state){
   case INI:
     a= 3;
     data=d;
     p.en=0;
     if(data.en){
        state=EXEC;
     }
     break;
   case EXEC:
      a = a*data;
      state=EXEC1;
   break;
   case EXEC1:
      a = a+2;
      state=DOUT;
   break;
   case DOUT:
      p.d=a;
      p.en=1;
      state=INI;
     break;
    }
  }
 }
}
```

FIG. 6A

```
do {
  switch(s0) {
    case 0:
    ...
    break;
    case 1:
    ...
    break;
    case 2:
      a++;   //parallel
      b=-2;  //parallel
    case 3:
      if(s1==0 & s2==0) {
        s0 = 4;
      } else {
        s0 = 3;
      }
      break;
    case 4
    ...
    break;
  }
} while(s0!=0);
```

FIG. 6B

```
thread rise ( clk ) {
  switch(s0) {
    case 0:
    ...
    case 3:
      if(s1==0 & s2==0) {
        s0 = 4;
      } else {
        s0 = 3;
      }
      break;
    case 4:
    ...
    break;
  }
} thread rise ( clk rst )
  if(!reset. rst)
    a=0.
  else if(s0==2)
    a=a+1;

thread rise ( clk rst )
  if(!reset. rst)
    b=0,
  else if(s0==2)
    b=b-2,
```

FIG. 6C

```
do {
  switch(s0) {
    case 0:
    ...
    break:
    case 1
    ...
    break.
    case 2
      do {
        switch(s1) {
          case 0:
          ...
          case 1
          ...
          case 2:
          ...
        }
      } while(s1!=0).
      do {
        switch(s2) {
          case 0:
          ...
          case 1.
          ...
        }
      } while(s2!=0),
      if(s1==0 & s2==0) {
        s0 = 4,
      } else {
        s0 = 3,
      }
      break.
      case 3
      ...
      break.
  }
} while(s0!=0).
```

FIG. 6D

```
thread rise( clk ) {
  switch(s0) {
    case 0:
    ...
    case 2:
      if(s1==0 & s2==0) {
        s0 = 4,
      } else {
        s0 = 3,
      }
      break,
      case 3
      ...
      break,
  }
} thread rise ( clk ) {
  if(s0==2) {
    switch(s1) {
      case 0:
      ...
      case 2.
      ...
    } else {
      s1=0.
    }
  }
} thread rise ( clk ) {
  if(s0==2) {
    switch(s2) {
      case 0:
      ...
      case 2:
      ...
    } else {
      s1=0.
    }
  }
}
```

FIG. 10A

```
void crc(
    USHORT  length,
    UCHAR   *dd,
    ULONG   *CRC,
    UCHAR   crctype
)
{
    int size,type;
    for(i=0; i< lenght; i++)          ──A
    {
        data[i] = *(dd+i);
    }
    size = length;                    ──B1
    type = crctype;                   ──B2
    com_crc (length, dd, CRC, type);  ──C
}
```

FIG. 10B

```
void memory1(
    USHORT  length,
    UCHAR   *dd,
)
{
    for(i=0; i< lenght; i++)
    {
        data[i] = *(dd+i);
    }
} void param1(
    USHORT  length,
    UCHAR   crctype
)
{
    size = length;
    type = crctype;
} void exec1(
    USHORT  length,
    UCHAR   *dd,
    ULONG   *CRC,
    UCHAR   crctype
)
{
    com_crc (length, dd, CRC, type);
}
```

FIG. 11A

```
{
tmpCrc = 0x0,                                          A
    for(i=0, i<length, i++)
    {
    data = *( dd+i);
    for(j=1, j<= 8, j++)
                {
                bit = (data>>(j -1)) & 1;
                carry = tmpCrc & 0x0800,
                tmpCrc <<= 1,
                if(!carry^!bit)                        B
                    {
                    tmpCrc ^= 0x080F,
                    }
                }
    }
*CRC = tmpCrc,                                         C
return,
}
```

FIG. 11B

```
{
do{
    switch(state){
    case crcinit :
        CrcReg =0x0,
        actenable = 0,
        state = crcexec;
    break;
    case crcexec :
    for(i=0, i<length, i++) {
        do{
        switch( actenable ){
            case 0:
              crcData = imSetData [i],
              actenable = 1;
            break;
            case 1:
            for(j=1, j<= 8, j++) {
                bit = ( crcData >>(j-1)) & 0x01,
                carry = ( CrcReg  >> 11) & 0x0001,
                if(carry^bit) {
                    CrcReg = ((CrcReg <<1) ^ 0x080F),
                }
                else {
                    CrcReg <<= 1;
                },
            };
            actenable = 0;
            break;
            default : actenable = 0; break;
        },
        }while( actenable != 0);
        if(i == (length -1)) {
            state = crcend ;
        };
    };
    break;
    case crcend :
      CrcReg  = CrcReg ,
      osRdCrcCode  = CrcReg ,
      state = crcinit ,
    break;
    default : state =  crcinit ;
    }
}while(state != crcinit);
};
};
```

METHOD OF DESIGNING A LOGIC CIRCUIT UTILIZING AN ALGORITHM BASED IN C LANGUAGE

BACKGROUND OF THE INVENTION

The present invention relates to logic circuit design, and more particularly, to technology of top-down design from C language description.

Conventionally, hardware of a logic circuit has been designed with a hardware description language (HDL) such as Verilog-HDL and VHDL. In recent years, with the advent of system level description languages called SpecC and SystemC, hardware design with a C language has become a focus of attention.

One of prior art techniques provides a language with which simulation can be performed at an intermediate level between algorithm description and register transfer (RT) level description (disclosed in Japanese Laid-Open Patent Publication No. 2001-109788). FIG. 16 illustrates a conventional logic simulation system, in which an algorithm description 103 is degraded to clock level description. A plurality of functions of the algorithm description 103 are disassembled into partial functions operable in a unit clock, and the partial functions are assembled to enable the plural functions to operate. The plurality of functions are expressed in a language using a register as a variable, in the form of a clock level simulator 108 that is a clock level description.

As shown in FIG. 16, a clock level verification section 106 is provided between an algorithm verification section 102 and a RT level verification section 116. The clock level verification section 106 includes a clock level system 107, which includes the clock level simulation model 108 as the clock level description and a clock level CPU model 109. The clock level system 107 is automatically generated by a build-in C compiler 111, and the description thereof is converted using a register, a tool provided by a general-use function synthesis tool 112, as a term (a word or a linear variable). The algorithm description 103 is converted into the clock level simulation model 108 with a model conversion tool 113 having a tool described in the function synthesis tool 112. The clock level CPU model 109 is automatically generated from a C program 104 by the build-in C compiler 111. A clock base simulator 114 is formed of the clock level simulation model 108 and the clock level CPU model 109.

The prior art technique has the following problems. In recent years, operation synthesis tools and the like enabling direct conversion into RT level description in HDL have become available. However, circuits designed with such tools are not only significantly large in scale but also low in quality, compared with circuits directly designed with RT level description. In addition, since free control of the circuit configuration is not allowed for circuits designed with the above tools, it is very difficult to obtain a circuit intended by the designer, and also very difficult to read a designed circuit.

In the prior art technique described above, a model is generated considering all of three main hardware components, namely, the data path, the control and the clock. Therefore, the logic verification using the clock level simulator remains complicated although the speed of the verification is faster than RT level verification. In addition, due to the disassembly into functions processible in clock units, the level of abstraction of the resultant description is degraded, resulting in a description as low as the RT level. Therefore, the prior art technique fails to solve the problems relating to the RT level design, such as difficulty in response to change of specifications and complexity in examination of hardware architecture. This still requires detailed design and examination as those required in the RT level design.

To state more specifically, the description is hardware-oriented to enable clock-unit operation. For example, the clock level verification includes not only the clock but also reset. Although the reset is required to determine the initial state of hardware, it is not required at the stage of examination of hardware architecture and verification of functions. It is rather important to clarify basics of hardware such as the unit of processing, the function block and the unit of control.

The examination of hardware architecture and design/verification of hardware functions considering clock operation are equivalent to examining three functions of computation function, control function and timing function simultaneously. This complicates the concept. In other words, the clock and the reset are unnecessary during the examination of hardware architecture and the design of hardware functions, and rather cause complexity of the examination. This fails to make use of the advantage of the design in a C language providing a high level of abstraction.

In the prior art technique described above, to obtain the clock level simulation model 108, it is necessary to write detailed control description by disassembling processing in clock units with a control data flow graph (CDFG) or the like. In this situation, design will be considerably difficult without visualization of hardware in cycle operation.

In the description of the clock level simulation model 108, one "case" sentence corresponds to one clock, and the relevant function is broken for each "case" to simulate a clock. Therefore, to terminate processing for the function, the function must be called repeatedly every cycle. This will be a major cause of reduction in simulation speed. Moreover, one state transition must be allocated to one function.

SUMMARY OF THE INVENTION

An object of the present invention is providing a method of designing a logic circuit capable of designing hardware with good quality from an algorithm description written in a pure C language efficiently in a short period of time.

The present invention provides a method of designing a logic circuit, including the steps of: converting an algorithm C description describing an algorithm of computation or control of the logic circuit in a C language into a functional C description describing control of hardware by rewriting the algorithm C description according to states in units of processing and describing the processing execution order as state transition (algorithm-functional C conversion step); converting the functional C description generated in the algorithm-functional C conversion step into a register transfer (RT) level C description by inserting a clock description as the conception of time in the functional C description (functional-RTLC conversion step); and converting the RT level C description generated in the functional-RTLC conversion step into a RT level description in HDL (RTLC-HDL conversion step).

According to the invention described above, hardware of a logic circuit can be easily designed based on an algorithm C description written in an existing pure C language such as ANSI-C and C++. In addition, since the functional C description is generated by splitting the algorithm C description into a plurality of states in units of processing irrelevant of a clock cycle, it can be expressed to execute one state in a plurality of cycles. The functional C description is therefore suitable as a description style for examining the hardware architecture at a higher level of abstraction. This enables examination of the hardware architecture at a higher level of abstraction than that conventionally adopted.

Preferably, the algorithm-functional C conversion step includes the step of splitting the algorithm C description into a plurality of states including at least one idle state or initializing state. By this splitting, even when a clock description is inserted in the functional-RTLC conversion step, the idle state is resumed whenever no operation is performed. This eliminates the necessity of cycle adjustment when the conception of time is added to a state machine. Only the insertion of a clock description is enough.

Preferably, the algorithm-functional C conversion step includes the step of splitting the algorithm C description into at least a data input state corresponding to data input processing, a computation state corresponding to computation processing, and a result output state corresponding to data output processing. By this splitting, the conversion style to the functional C description can be unified. In addition, the data input state and the result output state can be expressed as states of performing data input/output from/to the outside of a state machine or a module. Therefore, the timing of a clock cycle during data transfer between functions can be easily adjusted when the clock description is inserted in the functional-RTLC conversion step.

Preferably, the method further includes the step of: verifying functions of hardware including only the data path and the control and excluding the clock using the functional C description (function verification step), wherein the functional-RTLC conversion step is processed when the hardware functions are confirmed correct in the function verification step.

By the above verification, the data path and the control as hardware components can be finalized at an early stage of design. In addition, since no conception of time exists in the functional C description, the function verification can be performed at high speed and easily. Correction during design change is also easy. This greatly shortens the time required for the design. Furthermore, the execution cycle of each state can be estimated in detail by inserting a clock counting function for each state. This enables estimation of processing performance with high precision. In other words, the functional C description can be used in place of a functional model (simulation model) written in a C language, which is normally prepared in parallel with hardware, and thus redundant development can be avoided.

Preferably, the method further includes the step of: verifying operation of clock cycle timing of hardware using the RT level C description (operation verification step), wherein the RTLC-HDL conversion step is processed when the clock cycle timing operation is confirmed correct in the operation verification step. By this verification, at the stage of generation of the RT level C description, operation can be verified taking notice of a problem arising in relation with the clock cycle timing. This facilitates the verification, and thus improves the verification efficiency and the debugging efficiency. As a result, the time required for the design is shortened.

Preferably, in the algorithm-functional C conversion step, the state transition is described in a "switch" sentence, each of the units of processing is described by multibranch expression, the execution order is expressed by clarifying a transition destination in a "case", and one state machine is described so as to close itself by use of a loop expression.

Therefore, the state machine can be described in an existing C language without changing the algorithm operation. In other words, it is possible to execute computation processing operation in the state machine correctly with insertion of state transition expression without use of a special exclusive language. In addition, since the state transition is not broken every cycle, it is unnecessary to allocate one state transition to one function. It is unnecessary, either, to call a function every cycle, and thus simulation can be executed at high speed. This indicates that the "control" as a hardware component can be clearly embedded in the computation processing in a C language, and thus the computation part and control part of hardware can be described in the functional C description. This enables not only examination of the hardware architecture at an early stage, but also execution of function verification at high speed.

Preferably, in the algorithm-functional C conversion step, when a plurality of processing items are executed in parallel in one state, each of a plurality of state machines is described so as to close itself by use of a loop expression. Therefore, parallel operation can be easily described in the algorithm C description in a C language while maintaining the feature of high-speed simulation of the C language without the necessity of changing the operation. This means that description considering parallel operation is possible during examination of the hardware architecture. This enhances the degree of freedom in hardware examination at an early stage and also enables description of an advanced control method. Thus, during the conversion to the RT level C description, also, the description can be easily changed to parallel operation description.

Preferably, the method further includes the step of rewriting the algorithm C description according to modules taking notice of hardware functions to generate an algorithm C description for each module, as preprocessing to the algorithm-functional C conversion step (module separation step).

With the above step, the hardware architecture can be examined at a stage of a higher level of abstraction, and thus a hardware-specific function can be intentionally separated. Therefore, the computation processing function, the storage function and the like can be easily separated. This facilitates the design in the next algorithm-functional C conversion step, and also facilitates the design of the RT level C description. In addition, it is easy to reflect any partial change to relevant function units.

Preferably, in the module separation step, the algorithm C description is split into at least a memory part and a computation processing part. By this separation, replacement with a memory library is facilitated during generation of a RT level code in HDL. This enables design considering the hardware architecture at an early stage. Therefore, the circuit scale can be prevented from becoming large, enabling design considering a memory, as in the design in HDL. In addition, this facilitates change of a memory to be used and the like. Moreover, since design and simulation can be made by converting only the computation processing part into the functional C description or the RT level C description, the designability and the simulation speed improve.

Preferably, in the module separation step, an operator corresponding to a soft macro or hard macro of hardware is separated from the algorithm C description as an individual module. By this separation, replacement with a macro library such as a multiplier macro during generation of a RT level code in HDL is facilitated. This enables design considering the hardware architecture at an early stage. Also, increase in circuit scale, which may otherwise be caused when automatic synthesis or the like is adopted, can be definitely prevented. In addition, since design and simulation can be made by converting only the computation processing part, excluding the multiplier macro and the memory part, into the functional C description or the RT level C description, the designability and the simulation speed improve.

Preferably, in the module separation step, a parameter setting register part for computation processing is separated from the algorithm C description as an individual module. By this separation, partial change, such as change of the number of registers, is possible without changing the code in the computation processing part and the like. Also, since there is no need to search for a desired variable name in a large code, debugging is facilitated in malfunction analysis during function verification. In addition, when implemented as hardware, the register part can be easily replaced with a memory.

Preferably, in the functional-RTLC conversion step, a state transition description representing the control and a computation processing description representing the data path are extracted from the functional C description, and a clock description as the conception of time is inserted in each of the extracted state transition description and computation processing description. Therefore, as in the description of the RT level in HDL, the code readability improves, and debugging in malfunction analysis during verification improves.

Preferably, in the functional-RTLC conversion step, the RT level C description is generated by adopting grammar of SystemC or SpecC. Therefore, the design language can be determined after the verification of the hardware function independent of the design language. Thus, design can be started without the necessity of determining the design language, the simulation tool, the operation synthesis tool and the like at the start of development. This greatly improves the development efficiency, and shortens the time required for the development.

The present invention also provides a computer-readable recording medium including a recorded program, the program enabling a computer to execute the steps of: converting an algorithm C description describing an algorithm of computation or control of a logic circuit in a C language into a functional C description describing control of hardware by rewriting the algorithm C description according to states in units of processing and describing the processing execution order as state transition (algorithm-functional C conversion step); and converting the functional C description generated in the algorithm-functional C conversion step into a register transfer (RT) level C description by inserting a clock description as the conception of time into the functional C description (functional-RTLC conversion step).

The present invention further provides a program prepared to enable a computer to execute the steps of: converting an algorithm C description describing an algorithm of computation or control of a logic circuit in a C language into a functional C description describing control of hardware by rewriting the algorithm C description according to states in units of processing and describing the processing execution order as state transition (algorithm-functional C conversion step); and converting the functional C description generated in the algorithm-functional C conversion step into a register transfer (RT) level C description by inserting a clock description as the conception of time into the functional C description (functional-RTLC conversion step).

BRIEF DESCRIPTION OF THE DRAWINGS

FIGS. 4A and 4B are illustrations of an example of state separation in Embodiment 1 of the invention.

FIG. 5 is an illustration of an example of a RT level description with insertion of a clock description.

FIGS. 6A to 6D are illustrations of examples of descriptions representing parallel operation and state separation of a description.

FIGS. 10A and 10B are illustrations of an example of state separation in Embodiment 2 of the invention.

FIGS. 11A and 11B are illustrations of an example of conversion of a state-separated description in Embodiment 2 of the invention.

FIGS. 15A and 15B are illustrations of an example of a converted description in Embodiment 3 of the invention.

DESCRIPTION OF THE PREFERRED EMBODIMENTS

Hereinafter, preferred embodiments of the present invention will be described with reference to the accompanying drawings.

Embodiment 1

Figure 1:
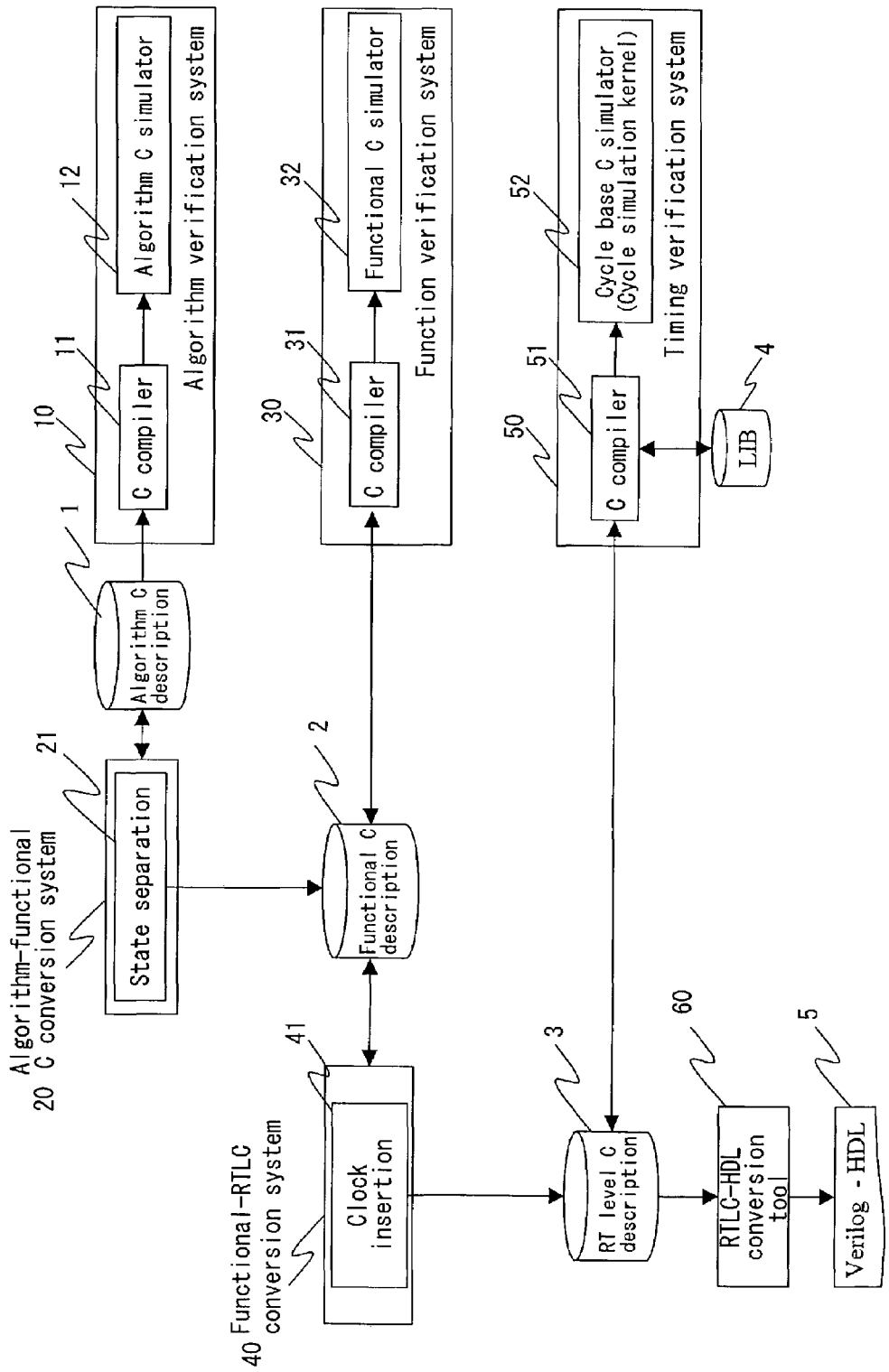
FIG. 1 is an illustration of a configuration of a top-down design system from C language description of Embodiment 1 of the present invention.

FIG. 1 illustrates a configuration of a logic circuit design system of Embodiment 1 of the present invention, which is a hardware top-down design system from C language description. Referring to FIG. 1, the reference numeral 1 denotes an algorithm C description, which is a description of an algorithm of computation or control of a logic circuit as a design object system written in a C language, 2 denotes a functional C description describing control of hardware, 3 denotes a RT level C description, which is a C language description at a register transfer (RT) level. The algorithm C description 1 is written in an existing C language such as ANSI-C and C++.

An algorithm verification system 10 generates an algorithm C simulator 12 by compiling the algorithm C description 1 with a C compiler 11. An algorithm-functional C conversion system 20, which includes a state separation means 21, converts the algorithm C description 1 into the functional C description 2. A function verification system 30 generates a functional C simulator 32 by compiling the functional C description 2 with a C compiler 31. A functional-RTLC conversion system 40, which includes a clock insertion means 41, converts the functional C description 2 into the RT level C description 3. A timing verification system 50 generates a cycle base C simulator 52 by compiling the RT level C description 3, together with a library 4 for permitting clock description, with a C compiler 51.

An existing conversion tool 60 for converting C language grammar into HDL description is used for conversion of the RT level C description 3 into Verilog-HDL 5 as a RT level description in HDL.

Figure 2:
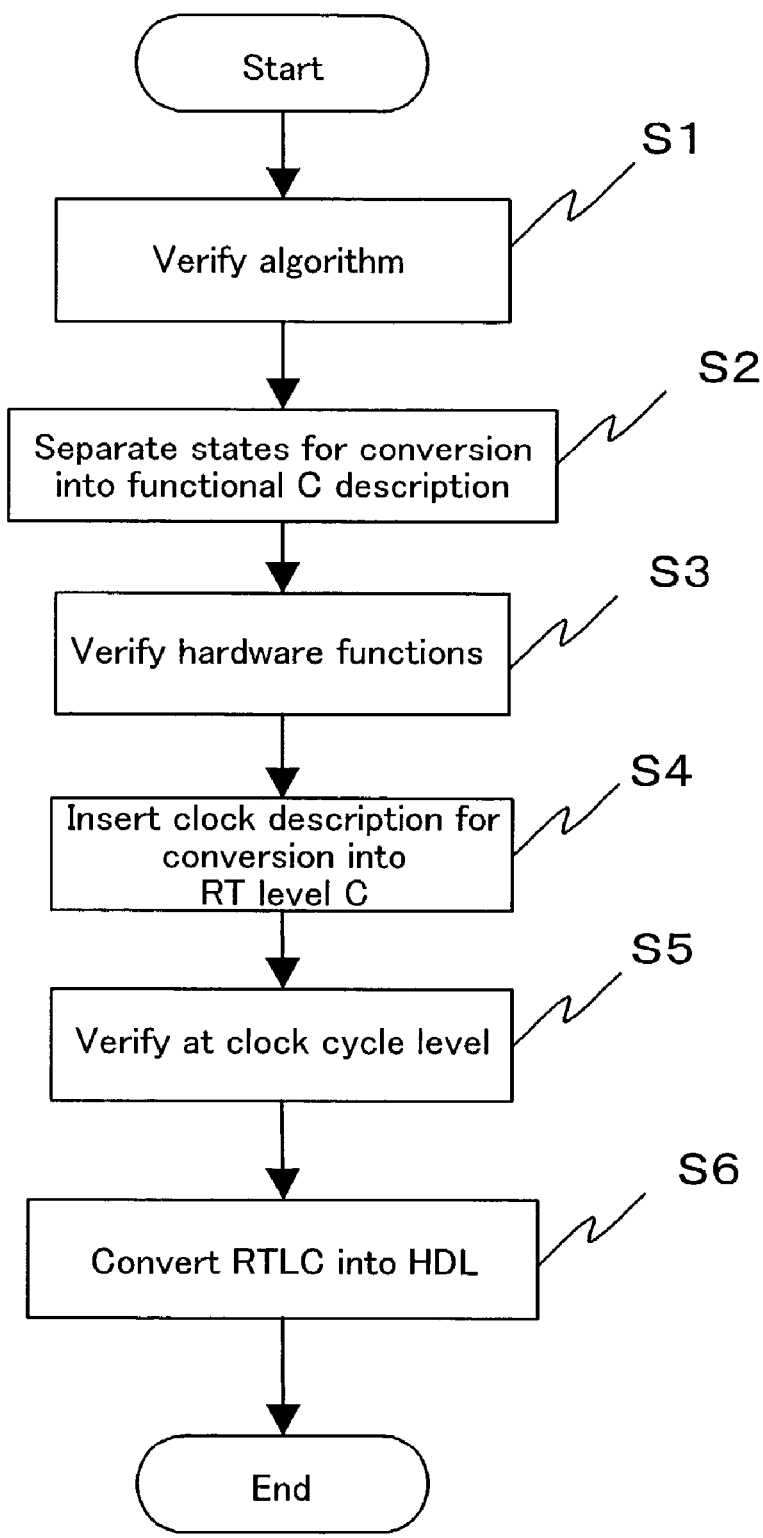
FIG. 2 is a flowchart of processing of a method of designing a logic circuit of Embodiment 1 of the invention.

FIG. 2 is a flowchart of the logic circuit design method of this embodiment. In FIG. 2, step S1 is an algorithm verification step in which an algorithm is verified using the algorithm C simulator 12. Step S2 is an algorithm-functional C conversion step in which after finalization of the algorithm in step S1, a description in a module of the algorithm C description 1 is split into states in functional units of processing by the algorithm-functional C conversion system 20, to thereby convert the algorithm C description 1 into the functional C description 2. Step S3 is a function verification step in which hardware functions in the functional C description 2 obtained in the step S2 are verified using the functional C simulator 32. Step S4 is a functional-RTLC conversion step in which after finalization of the functions in the step S3, a clock description is inserted in the functional C description 2, to thereby convert the functional C description 2 into the RT level C description 3. Step S5 is an operation verification step in which the operation of the RT level C description 3 is verified using the cycle base C simulator 52 taking notice of the timing of the clock cycle. Step S6 is a RTLC-HDL conversion step in which after confirmation of the operation at the clock timing in the step S5, the RT level C description 3 is converted into the Verilog-HDL 5 with the conversion tool 60.

Hereinafter, the logic circuit design method of this embodiment will be described with reference to FIGS. 1 to 5.

First, in the algorithm verification step S1, the algorithm C description 1 is compiled by the C compiler 11, such as cc and gcc, in the algorithm verification system 10, to generate the algorithm C simulator 12 for verification of the algorithm. Computation processing (data path) only is then verified using the algorithm C simulator 12. Together with this verification, whether or not the algorithm has been finalized is determined. Correction of the algorithm C description 1 and verification of the corrected description are repeated until the algorithm has been finalized.

In the algorithm-functional C conversion step S2, after finalization of the algorithm in the algorithm verification step S1, the algorithm C description 1 is converted into the functional C description 2 by rewriting the algorithm C description 1 according to the states in units of processing. For example, a description in each module of the algorithm C description 1 is split into states in units of processing, such as the initializing state corresponding to data input processing, the computation executing state corresponding to computation processing, and the result outputting state corresponding to data output processing. In addition, the transition destinations, transition conditions and transition order of the separated states are described. In this way, the description corresponding to "control" of hardware is embedded in the functional C description 2.

The conversion processing described above can be implemented by embedding a keyword, in the form of a comment sentence or the like, in a line at which splitting is desired, and performing program conversion according to the keyword.

Figure 3:
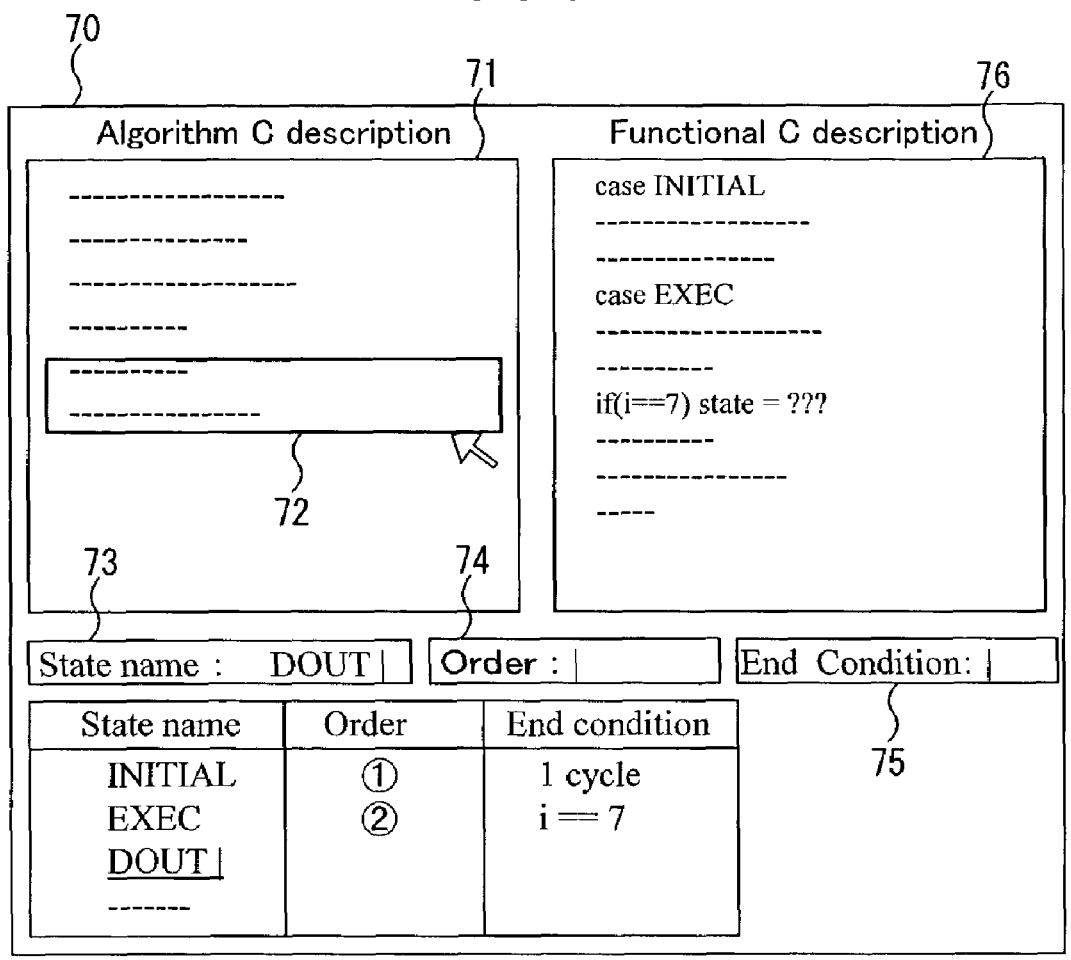
FIG. 3 is an illustration of an example of splitting of algorithm C description with GUI in Embodiment 1 of the invention.

Herein, a method of the state separation with GUI will be described with reference to FIG. 3. Referring to FIG. 3, an algorithm C description 71 before conversion is displayed on a GUI screen 70. The user selects a portion 72 recognized as a group of processing on the screen, and specifies the state name in "State name" 73, the execution order of the processing in "Order" 74. The user also enters the condition under which the state is broken in "End Condition" 75. By specifying as described above, a functional C description 76 after conversion is prepared by program conversion executed by the state separation means 21.

FIGS. 4A and 4B illustrate an example of state separation, in which FIG. 4A is an example of the algorithm C description before state separation and FIG. 4B is an example of functional C description after the state separation. In the algorithm C description shown in FIG. 4A, texts A, B and C are considered as representing an initializing and idle state, a computation executing state and a result outputting state, respectively, and the execution order can be as follows. After initialization in the text A, the process proceeds to the text B to execute computation processing. Once the computation end condition is satisfied in the text B, the process proceeds to the text C to output the computation result. Once the computation result is output, the process returns to the text A as the idle state.

As a result of the conversion according to the state separation and the execution order described above, a functional C description as shown in FIG. 4B is obtained. The separated units of processing A, B and C are respectively described in the form of a "case" in a "switch" sentence as multi-branched expression. The execution order of the units of processing is expressed by assigning the transition destination to the "state" in each "case". Although the "switch-case" sentence is used as multi-branched expression in the illustrated example, any other means may be used as long as multi-branched expression is provided.

Since the functional C description is written in a C language like the algorithm C description, the "switch" sentence is closed using a "do" "while" sentence. As the condition for breaking the "while" sentence, the idle state A is designated. With this description, during the execution of processing, the switch sentence is broken when the process returns to the unit of processing A after all the units of processing A, B and C are completed. This means that when this processing is executed next time, the process starts in the state of the unit of processing A. Although the "do" "while" sentence is used as loop expression to close a state machine in the illustrated example, other loop expression such as a "while" sentence and a "for" sentence may be used. In the case of using "while(1)", a "break" sentence may be inserted in the state C before returning to the idle state.

In other words, it is possible to complete the functional C description capable of expressing an operation equivalent to the algorithm of breaking the state transition at the time of termination of the processing and also having a description clarifying "control" of hardware embedded therein.

Hereinafter, the function and effect of providing the idle state will be described.

When a clock is inserted, a circuit always operates. However, by setting a state machine to always return to the idle state, the circuit maintains the idle state as long as the condition for state transition fails to be satisfied. If no idle state is provided, and when a clock is inserted, it is necessary to provide processing such as newly adding control to be taken when each function fails to operate. This complicates the timing design in the functional-RTLC conversion step S4.

Therefore, by clarifying the idle state during the preparation of the clock-free functional C description, it is possible to prevent an event that the function may fail to operate correctly when a clock is inserted. The existence of the idle state will not influence the operation at the stage of the functional C description. Thus, by providing the idle state or the initiating state, the functional C description can be easily converted into the RT level C description only with insertion of a clock.

Once the functional C description 2 is generated in the algorithm-functional C conversion step S2, the process proceeds to the function verification step S3. The hardware functions are verified using the functional C simulator 32 obtained by compiling by the C compiler 31. Herein, whether or not the computation function has been realized according to the control optimal for the hardware is verified. If there is a malfunction or change of specifications, the state separation in the algorithm-functional C conversion step S2 is corrected.

Since the functional C description 2 does not reflect a clock as the conception of time, the function verification is performed considering only the data path and the control, excluding the clock, among the three main components of hardware. The "data path" of hardware as used herein corresponds to computation processing, and the "control" corresponds to the state machine written in the form of a "switch" sentence. Due to the exclusion of the clock as the conception of time, the verification is prevented from becoming complicate.

Once it is determined that the hardware functions have been finalized in the function verification step S3, the process proceeds to the functional-RTLC conversion step 4. In this step, a clock description as the conception of time is inserted into the functional C description 2 by the clock insertion means 41 of the functional-RTLC conversion system 40, to generate the RT level C description 3. This insertion of a clock description is executed according to a conversion program.

FIG. 5 is an example of the RT level C description 3 obtained in an application to CoWareC for hardware/software co-design tool N2C. In FIG. 5, a "thread rise(clk)" sentence is inserted so that the entire state machine operates with a clock. Other processing is also performed, including that the states are further split in detail with reference to the execution time estimated in the functional C description 2. For example, in FIG. 4B, comment "//2Cycle" meaning that "2 cycles are required" is inserted in the EXEC state. In response to this comment, the EXEC state is split into EXEC and EXEC1, for example. In this processing, an "if" sentence may be used in place of the "switch" sentence. Also, the port is converted into a plurality of signals such as data and enable according to a port protocol. These conversions can be automated with a program.

Once the RT level C description 3 is prepared in the functional-RTLC conversion step S4, the hardware operation timing is verified with clock cycle precision in the operation verification step S5. Because the data path and the control have already been verified in the function verification step S3 described above, only the timing operation is verified in this step.

Once the timing operation is confirmed in the operation verification step S5, the RT level C description 3 is converted into the Verilog-HDL 5 with the conversion tool 60 in the RTLC-HDL conversion step S6.

Thus, in this embodiment, the functional C description 2 can be prepared by the description conversion at the same level as the algorithm C description 1. Therefore, hardware of a logic circuit can be easily designed based on the description written in an existing pure C language such as ANSI-C and C++.

In addition, the functional C description 2 has states separated according to the units of processing independent of a clock cycle. Therefore, one state can be expressed as being executed in a plurality of cycles. This means that the hardware architecture and the hardware control method can be examined at a higher level of abstraction than that conventionally adopted.

The functional C description 2 is obtained by splitting into the initializing state, the computation state and the result output state as basic states. Therefore, the conversion style can be unified. In addition, the initializing state and the result output state can be expressed as the states performing data input/output from/to the outside of a state machine or a module. Therefore, the timing of a clock cycle during data transfer between functions can be easily adjusted when the clock description is inserted in the functional-RTLC conversion step S4.

Only the data path and control of hardware are verified in the function verification step S3 for early finalization of the functions, excluding the clock timing. Therefore, the data path and the control as hardware components are finalized at an early stage of design. In addition, being free from the conception of time, high-speed function verification is possible, and correction is easy during verification and design change. This greatly shortens the time required for the design.

The execution cycle of the states can be estimated in detail by inserting a clock counting function for each state. It is therefore possible to estimate processing performance with high precision. In other words, the functional C description 2 can be used in place of a functional model (simulation model) written in a C language, which is normally prepared in parallel with the hardware, and thus redundant development is avoided.

The clock cycle timing verification is performed at the final stage. Therefore, the verification can be performed taking notice of a problem related to the cycle timing. This facilitates the verification, and thus improves the verification efficiency and also the debugging efficiency. As a result, the time required for the design can be shortened.

One state transition is completed by one "do" "while" sentence. Therefore, the state machine can be described in the same language such as ANSI-C or C++ without changing the algorithm operation. Thus, the computation processing in the state machine can be correctly executed even when state transition expression is inserted, without the necessity of using a special exclusive language.

There is no "break" of state transition every cycle. Therefore, it is unnecessary to allocate one state transition to one function. It is unnecessary, either, to call a function every cycle, and this enables high-speed simulation. This indicates that the "control" as a hardware component can be clearly embedded in the computation processing in a C language, and that the computation part and control part of hardware can be described in the function C description 2 without use of a special language. Thus, the hardware architecture can be examined at an early stage, and also function verification can be executed at high speed.

Hereinafter, expression of parallel operation in the algorithm-functional C conversion step S2 will be described.

FIGS. 6A to 6D are examples of expression of parallel operation. Assume that execution of a plurality of processing items in parallel in one state is desired, for example. As one method, as an example of the functional C description 2 shown in FIG. 6A, parallel processing may be explicitly stated in the form of a comment (for example, "//parallel") corresponding to each processing item (part enclosed by the dotted line). FIG. 6B shows an example of a description obtained by converting the functional C description 2 in FIG. 6A into the RT level C. As shown in FIG. 6B, the functional C description 2 may be converted so that two processing items operate in the same state "SO==2" as described in the functional C description 2.

There may be a case that each unit of processing must have state transition. In such a case, as shown in FIG. 6C, each state machine is described to close itself using a "do" "while" sentence (part enclosed by the dotted line). FIG. 6D shows an example of a description obtained by converting the functional C description 2 in FIG. 6C into the RT level C. As shown in FIG. 6D, the two state machines may be converted by inserting a conditional sentence so as to operate in the same state "SO==2" as described in the functional C description 2.

Thus, since the parallelability can be explicitly stated in the algorithm-functional C conversion step S2, parallel processing can be described in the functional C description 2 without the necessity of a special simulator, and also simulation can be done at high speed. In addition, since both the hardware control and the parallelability can be stated, conversion to parallel description is also facilitated during the conversion into the RT level C description.

FIG. 5 illustrates an example of description by CoWare C. However, description is possible as well by System C, Spec C and other languages only if they can describe clock.

Embodiment 2

Figure 7:
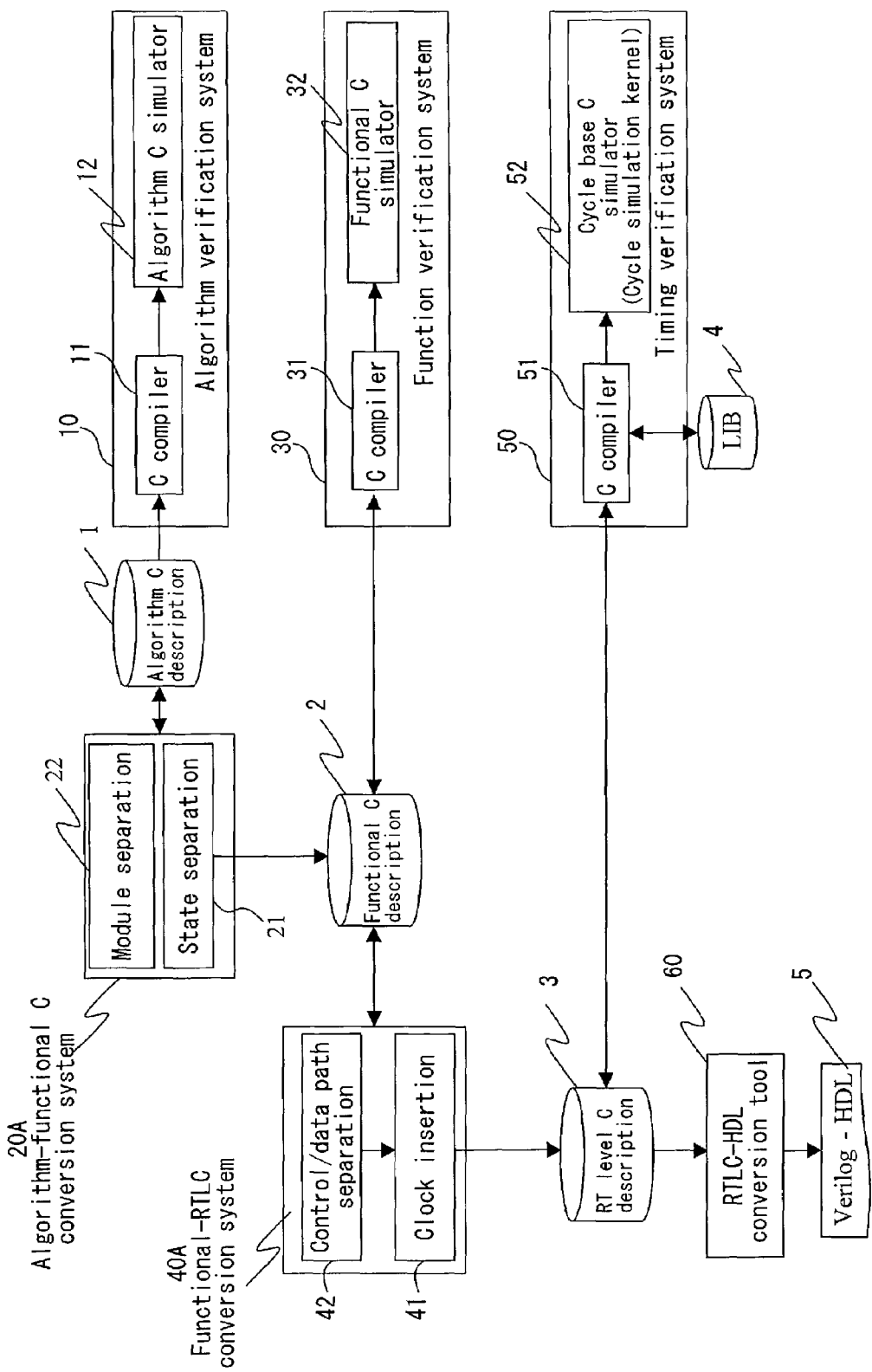
FIG. 7 is an illustration of a configuration of a top-down design system from C language description of Embodiment 2 of the present invention.

FIG. 7 illustrates a configuration of a logic circuit design system of Embodiment 2 of the present invention, which is a hardware top-down design system from C language description. In FIG. 7, the same components as those in FIG. 1 are denoted by the same reference numerals. In FIG. 7, an algorithm-functional C conversion system 20A includes a module separation means 22, which rewrites the algorithm C description 1 for each module taking notice of hardware functions, to perform module separation. A functional-RTLC conversion system 40A includes a control/data path separation means 42, which separates a state transition description representing "control" and a computation description representing "data path" from the function C description 2.

Figure 8:
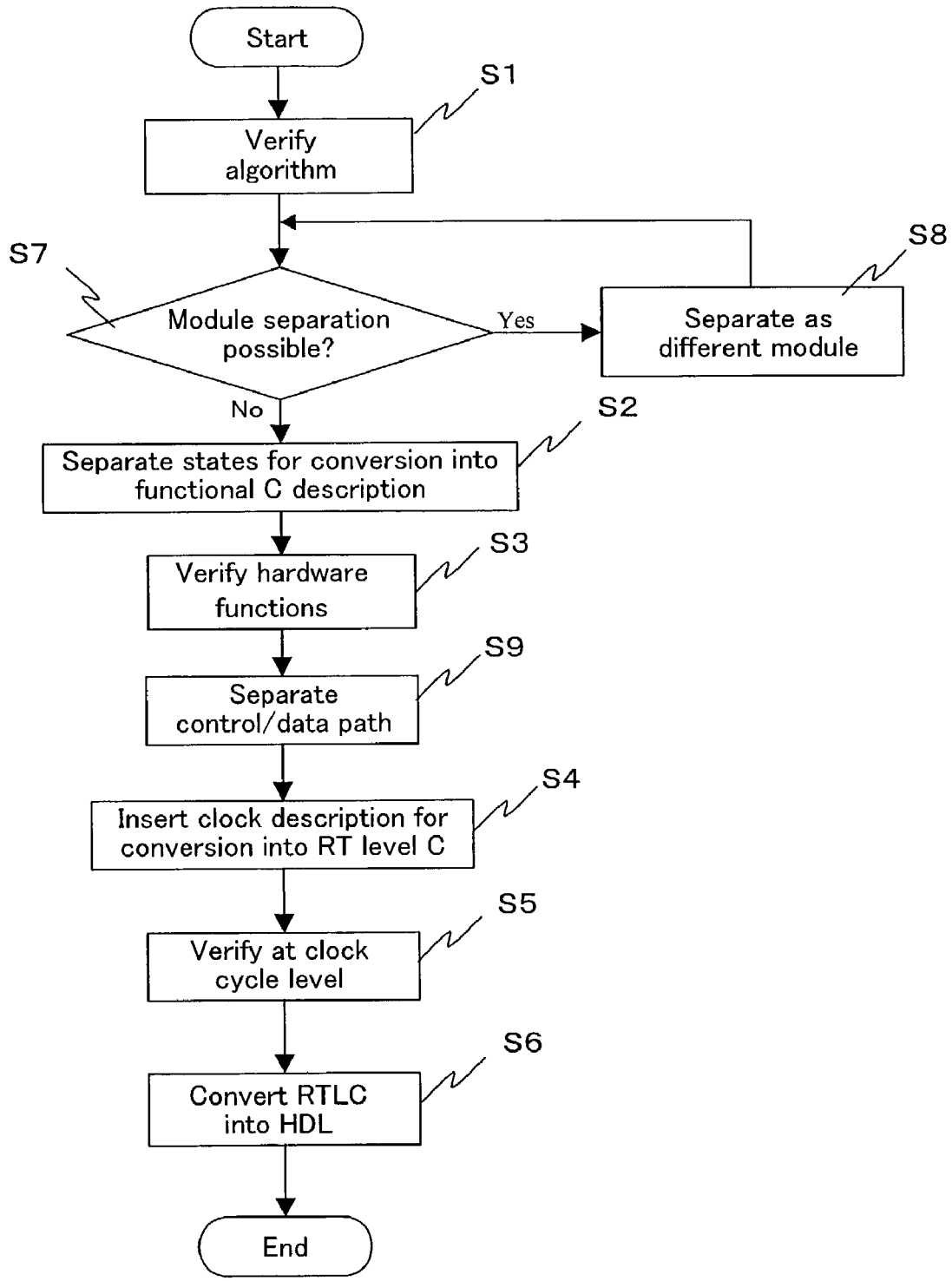
FIG. 8 is a flowchart of processing of a method of designing a logic circuit of Embodiment 2 of the invention.

FIG. 8 is a flowchart of the logic circuit design method of this embodiment. In FIG. 8, the same process steps as those in FIG. 2 are denoted by the same reference numerals. In FIG. 8, step S7 is a module separation determination step in which whether or not the algorithm C description 1 can be split into modules taking notice of hardware functions is determined. Step S8 is a module separation step in which functions specific to hardware such as a memory and a hard macro of the algorithm C description 1 are separated as different modules. Step S9 is a control/data path separation step in which a "switch" sentence description in a state machine representing the control and a computation processing description in a "case" sentence in the "switch" sentence are separated from the functional C description 2.

Hereinafter, the logic circuit design method of this embodiment will be described with reference to FIGS. 7 to 11.

First, in the algorithm verification step S1, as in Embodiment 1, the algorithm C description 1 is compiled by the C compiler 11 in the algorithm verification system 10, to generate the algorithm C simulator 12 for verification of the algorithm. Computation processing (data path) only is then verified using the algorithm C simulator 12. Together with this verification, whether or not the algorithm has been finalized is determined. Correction of the algorithm C description 1 and verification of the description are repeated until the algorithm has been finalized.

After the finalization of the algorithm in the algorithm verification step S1, whether or not the algorithm C description 1 can be split into modules by the module separation means 22 taking notice of its hardware functions is determined in the module separation determination step S7. When the algorithm C description 1 has a description part like an array corresponding to a memory, or a description part of multiplication in the case that use of a multiplier hard macro is assumed, such a description part is separated as an individual module. This processing can be realized by identifying the array or the hard macro using a conversion program or the like. Alternatively, the description splitting is possible by displaying codes with GUI or the like and performing cut and paste of the codes in computation units of processing.

Figure 9:
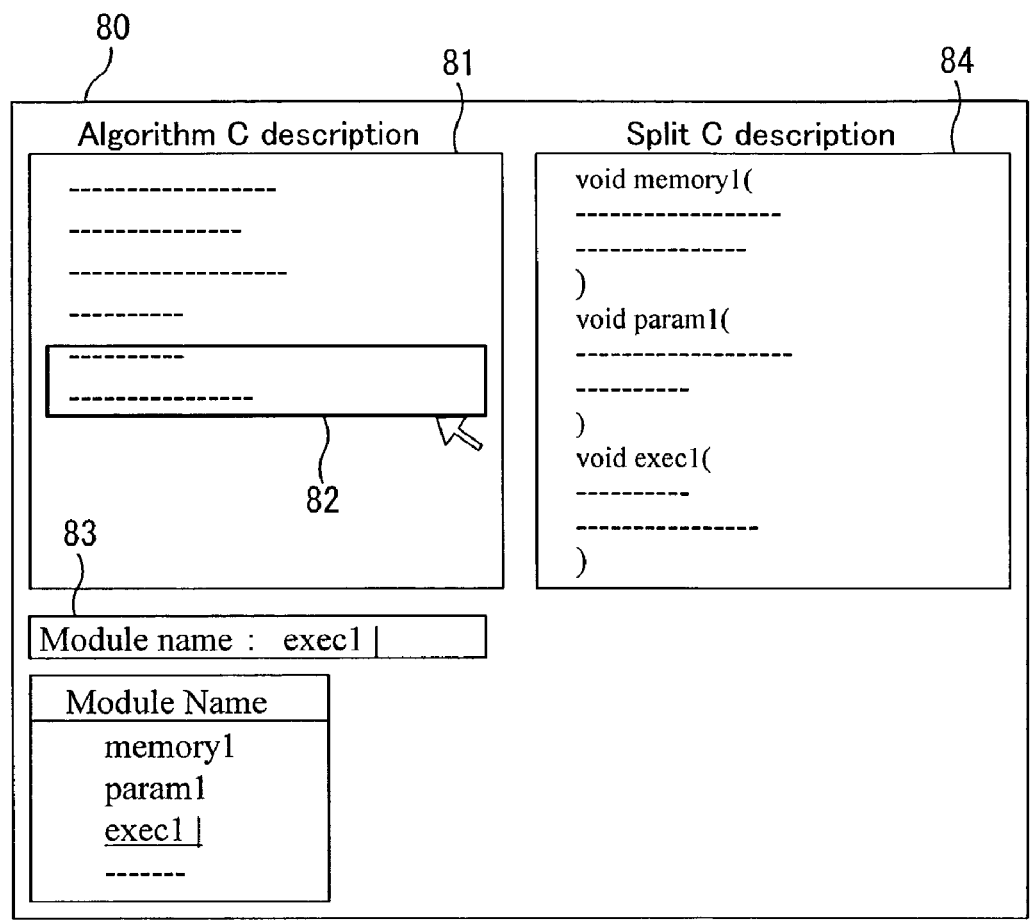
FIG. 9 is an illustration of an example of splitting of an algorithm C description with GUI in Embodiment 2 of the invention.

In this embodiment, a method of module separation with GUI will be described with reference to FIG. 9. Referring to FIG. 9, an algorithm C description 81 before conversion is displayed on a GUI screen 80 by opening a related file. The user selects a sentence assigned to an array corresponding to a memory, a multiplication part, or a plurality of parameter setting register parts, as a separating module part 82 on the screen, and specifies the module name in "Module name" 83. By specifying like this, a split C description after conversion is prepared by program conversion by the module separation means 22, and individual separated modules are displayed on a split C description display field 84.

FIGS. 10A and 10B illustrate an example of module separation, in which FIG. 10A illustrates the original algorithm C description and FIG. 10B illustrates the module-split algorithm C description. In FIG. 10A, part A for entry of data in an array corresponds to a memory part of hardware, and parts B1 and B2 for assignment of data to parameters correspond to register parts. Part C for calling a function corresponds to a computation execution part. The parts A, B1, B2 and C are separated as modules as shown in FIG. 10B. Once no description part specific to a hardware function exists in the separated modules, the process proceeds to the algorithm-functional C conversion step S2.

In the algorithm-functional C conversion step S2, in principle, a module having a hardware-specific function is not converted into the functional C description. When control of a signal line is included, for example, only part related to a logic circuit is concretized during conversion into the RT level C description. For the other part, state separation and clarification of state transition are performed for each module for conversion to the functional C description 2, as described in Embodiment 1. Herein, the module corresponding to the computation execution part is split into states for conversion to the functional C description 2.

FIGS. 11A and 11B illustrate an example of conversion into the functional C description 2, in which FIG. 11A illustrates the algorithm C description and FIG. 11B illustrates the functional C description. Part A represents the initializing state, part B represents the computation execution state, and part C represents the result output state. The computation execution state B may further be split into two states, and FIG. 11B shows an example of further split description. To state specifically, in FIG. 11B, the state B is further split into a state of data input from a memory or the like and a computation state. In this case, the state transition is in the order of initializing (idle) state A→data input state B1→computation execution state B2→result output state C→initializing (idle) state.

In the next function verification step S3, the control and data path of hardware are verified as in Embodiment 1, to finalize the hardware functions.

In the control/data path separation step S9, a "switch" sentence of a state transition description corresponding to "control" and a computation processing description corresponding to "data path" in a "case" sentence in a "switch" sentence are separated from the functional C description 2 by the control/data path separation means 42 of the functional-RTLC conversion system 40A. During this separation, a "for" sentence and the like are expanded to a counter description. Thereafter, in the functional-RTLC conversion step S4, a clock description is inserted, to generate the RT level C description 3.

Figure 12A:
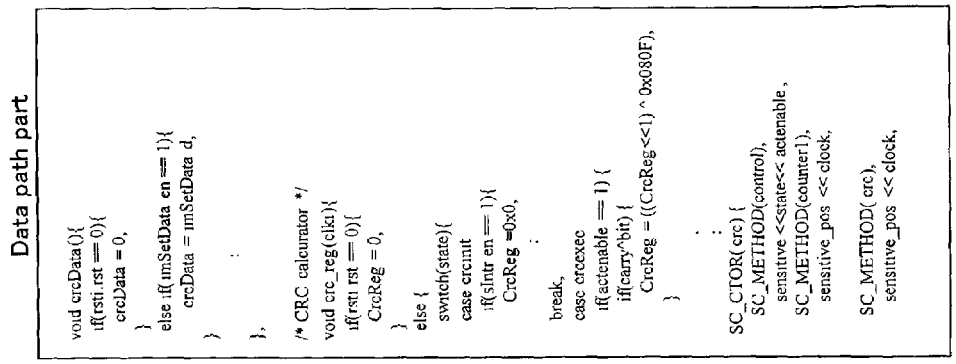
FIGS. 12A and 12B are illustrations of an example of conversion to a RT level C description in Embodiment 2 of the invention.
Figure 12B:
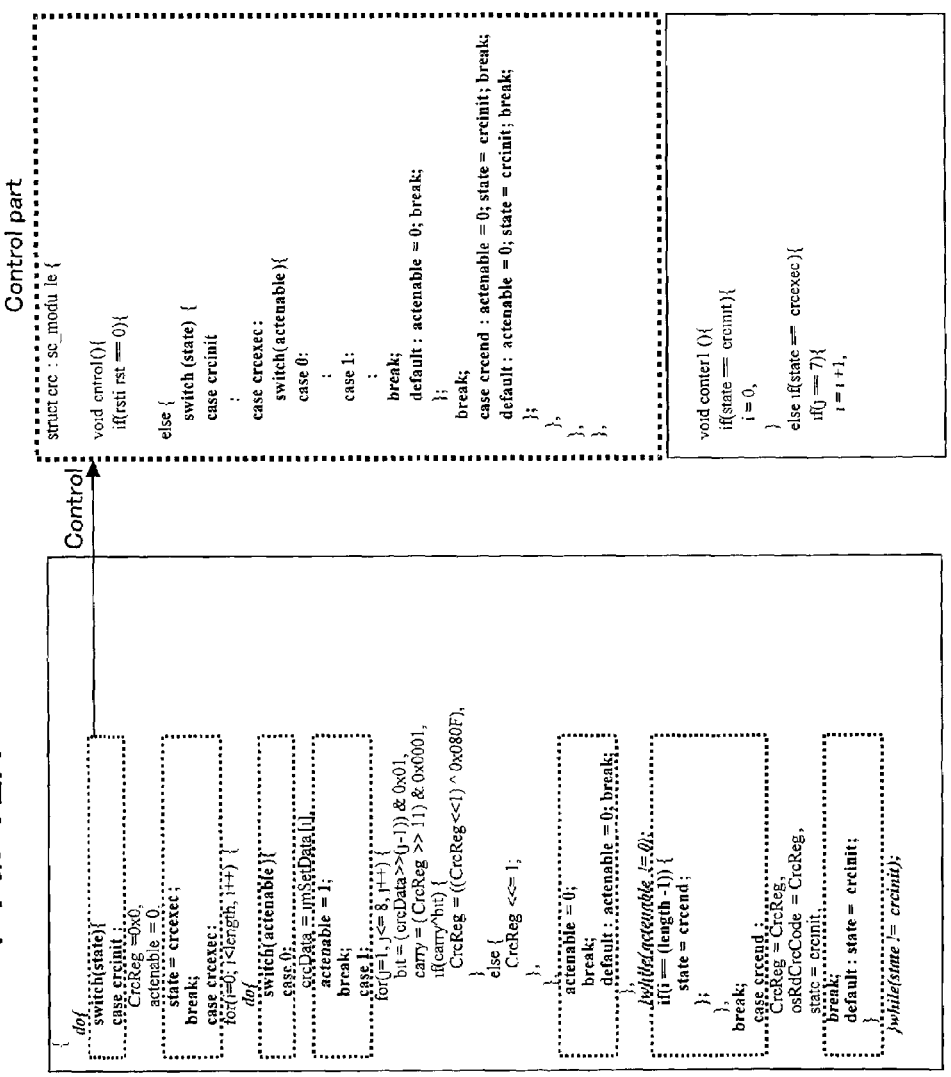

FIGS. 12A and 12B illustrate an example of conversion to the RT level C description according to CoWareC for hardware/software co-design tool N2C, in which FIG. 12A illustrates the original algorithm C description and FIG. 12B illustrates the RT level C description. The control part is extracted from the algorithm C description shown in FIG. 12A, to form a state machine, and a clock description is inserted in the state machine. Also, computation processing in each state in FIG. 12A is extracted individually taking notice of a same parameter. A control signal is added to the extracted computation processing so that only the state to which the computation processing has belonged is activated, and a clock description is inserted in each processing. The "for" sentence is separately expanded as a counter description. In this way, the RT level C description as shown in FIG. 12B is prepared. The description in FIG. 12B has roughly the same configuration as a RT level description in HDL. This means that this description is highly readable for hardware designers.

Subsequently, in the operation verification step S5, the timing verification system 50 executes timing verification using the RT level C description 3 generated in the functional-RTLC conversion step S4. When no problem is found in the timing operation, the RT level C description 3 is converted into the Verilog-HDL 5 in the RTLC-HDL conversion step S6.

Thus, in this embodiment, the algorithm C description 1 is split into a plurality of modules taking notice of hardware functions. This enables examination of the hardware architecture at a stage of a high level of abstraction, and thus enables intentional separation of hardware-specific functions. Therefore, computation processing function, the storage function and the like can be easily separated. This facilitates the splitting design in the next algorithm-functional C conversion step S2. In addition, since a description part of the algorithm C description 1 that may be verified as it is can be separated from the other, the RT level design is also facilitated.

The algorithm C description is split into the data input state, the computation state and the result output state as basic states. Therefore, the conversion style into the functional C description 2 can be unified. In addition, the data input state and the result output state can be expressed as the states performing data input/output from/to the outside of a state machine or a module. Therefore, the timing of a clock cycle during data transfer between functions can be easily adjusted when a clock description is inserted in the functional-RTLC conversion step S4.

In the latter half of the design, a state transition description representing the "control" is extracted from the functional C description 2, and also, a computation processing description representing the "data path" described in each state is extracted and separated individually for each variable, to prepare the RT level C description. Therefore, as in a RT level description in HDL, the code readability improves, and debugging in malfunction analysis during verification improves.

With the splitting into the memory part and the computation processing part, replacement thereof with a memory library is facilitated during generation of RTL codes in HDL. This enables design considering the hardware architecture at an early stage. Therefore, the circuit scale can be prevented from becoming large. This not only enables design considering a memory as in the design in HDL, but also facilitates change of a memory to be used and the like. Moreover, since only the computation processing part can be converted into the functional C description or the RT level C description for design and simulation, the designability and the simulation speed improve.

The parameter setting register part for computation processing is separated as an individual module. Therefore, partial change, such as change of the number of registers, is possible without changing a code in the computation processing part and the like. Also, since there is no need to search for a desired variable name in a large code, debugging is facilitated in malfunction analysis during function verification. In addition, when implemented as hardware, the register part can be easily replaced with a memory.

In the above description, separation of a memory part was exemplified. In the case that an operator such as a multiplier is defined as a soft macro or a hard macro of the hardware, the computation processing part thereof may be separated as an individual module.

Embodiment 3

Figure 13:
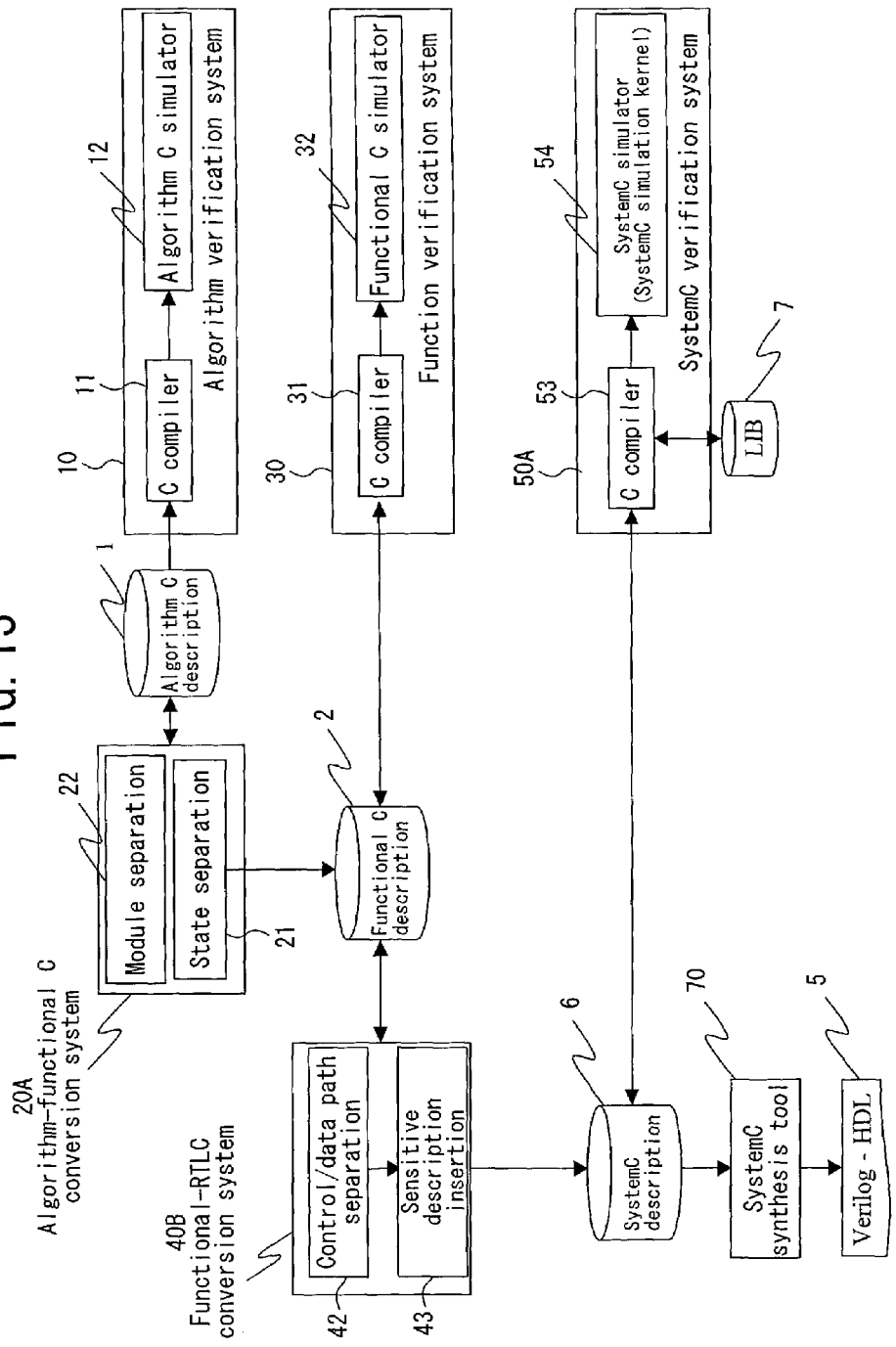
FIG. 13 is an illustration of a configuration of a top-down design system from C language description of Embodiment 3 of the present invention.

FIG. 13 illustrates a configuration of a logic circuit design system of Embodiment 3 of the present invention, which is a hardware top-down design system from C language description. In FIG. 13, the same components as those in FIG. 7 are denoted by the same reference numerals. In FIG. 13, a functional-SystemC conversion system 40B, a SystemC verification system 50A and a SystemC synthesis tool 70 are provided in place of the functional-RTLC conversion system 40A, the timing verification system 50 and the conversion tool 60 in FIG. 7. The functional-SystemC conversion system 40B includes the control/data path separation means 42 and a sensitive description insertion means 43 for sensitive designation, and converts the functional C description 2 into a SystemC description 6. The SystemC verification system 50A compiles the SystemC description 6 with a C compiler 53 using a SystemC library 7, to generate a SystemC simulator 54. The SystemC synthesis tool 70, which is made of a SystemC compiler from Synopsy, for example, converts the SystemC description 6 into the verilog-HDL 5.

Figure 14:
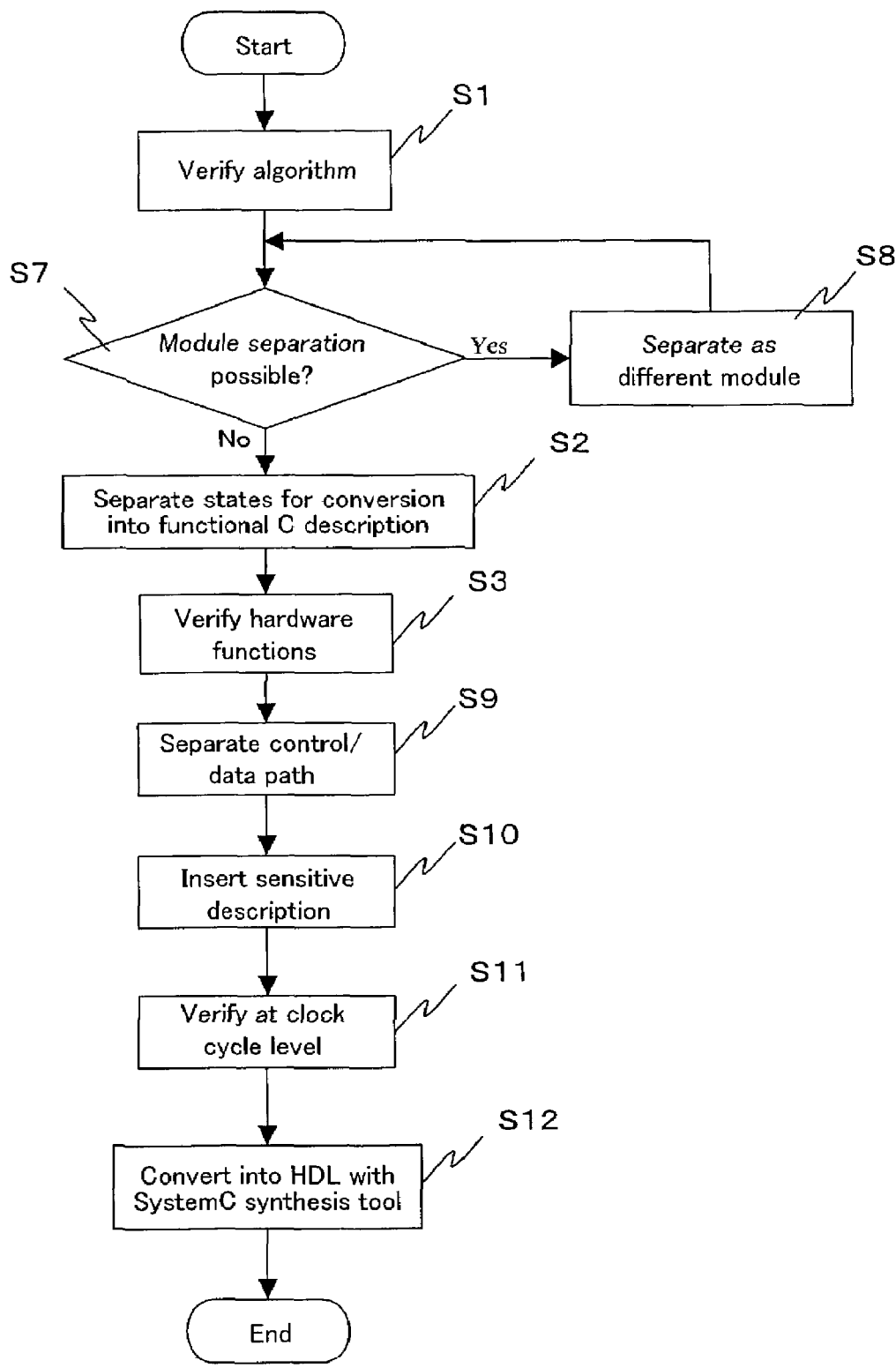
FIG. 14 is a flowchart of processing of a method of designing a logic circuit of Embodiment 3 of the invention.
Figure 16:
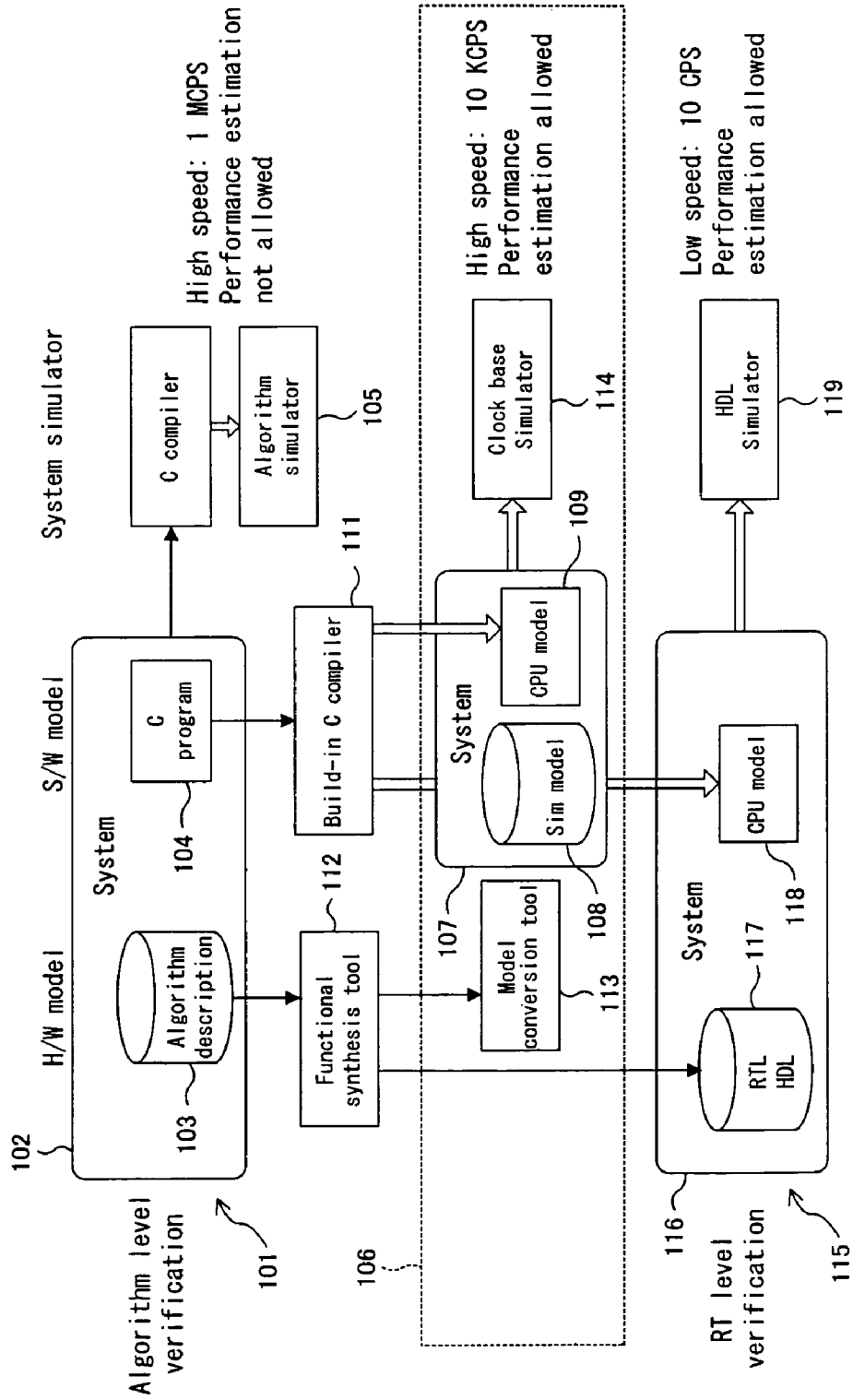
FIG. 16 is an illustration of a configuration of a conventional logic simulation system.

FIG. 14 is a flowchart of the logic circuit design method of this embodiment. In FIG. 14, the same steps as those in FIG. 8 are denoted by the same reference numerals. In FIG. 14, step S10 is a functional-SystemC conversion step in which a sensitive description is inserted in the functional C description 2 in the functional-SystemC conversion system 40B, to convert the functional C description 2 into the SystemC description 6. Step S11 is a SystemC verification step in which clock cycle simulation is performed using the SystemC simulator 54. Step S12 is a SystemC-HDL conversion step in which the SystemC description 6 is synthesized into the Verilog-HDL 5 with an existing synthesis tool. The conversion in the functional-SystemC conversion step S10 corresponds to the functional-RTLC conversion step according to the present invention.

Hereinafter, the logic circuit design method of this embodiment will be described with reference to FIGS. 13 to 15.

As in Embodiment 2, the functional C description 2 is generated in the algorithm-functional C conversion step S2, and the hardware functions are finalized in the function verification step S3. In the control/data path separation step S9, a control description describing state transition corresponding to the "control" of hardware and a data path description describing computation processing in each state corresponding to the "data path" are separated from the functional C description 2 by the control/data path separation means 42 of the functional-SystemC conversion system 40B. The data path description is provided individually for each parameter.

Subsequently, in the function-SystemC conversion step S10, a sensitive description is added to the control description and the data path description separated in the step S9. Along with this addition, conversion into SystemC grammar is performed using a conversion program, for example.

Figures 15A, 15B:
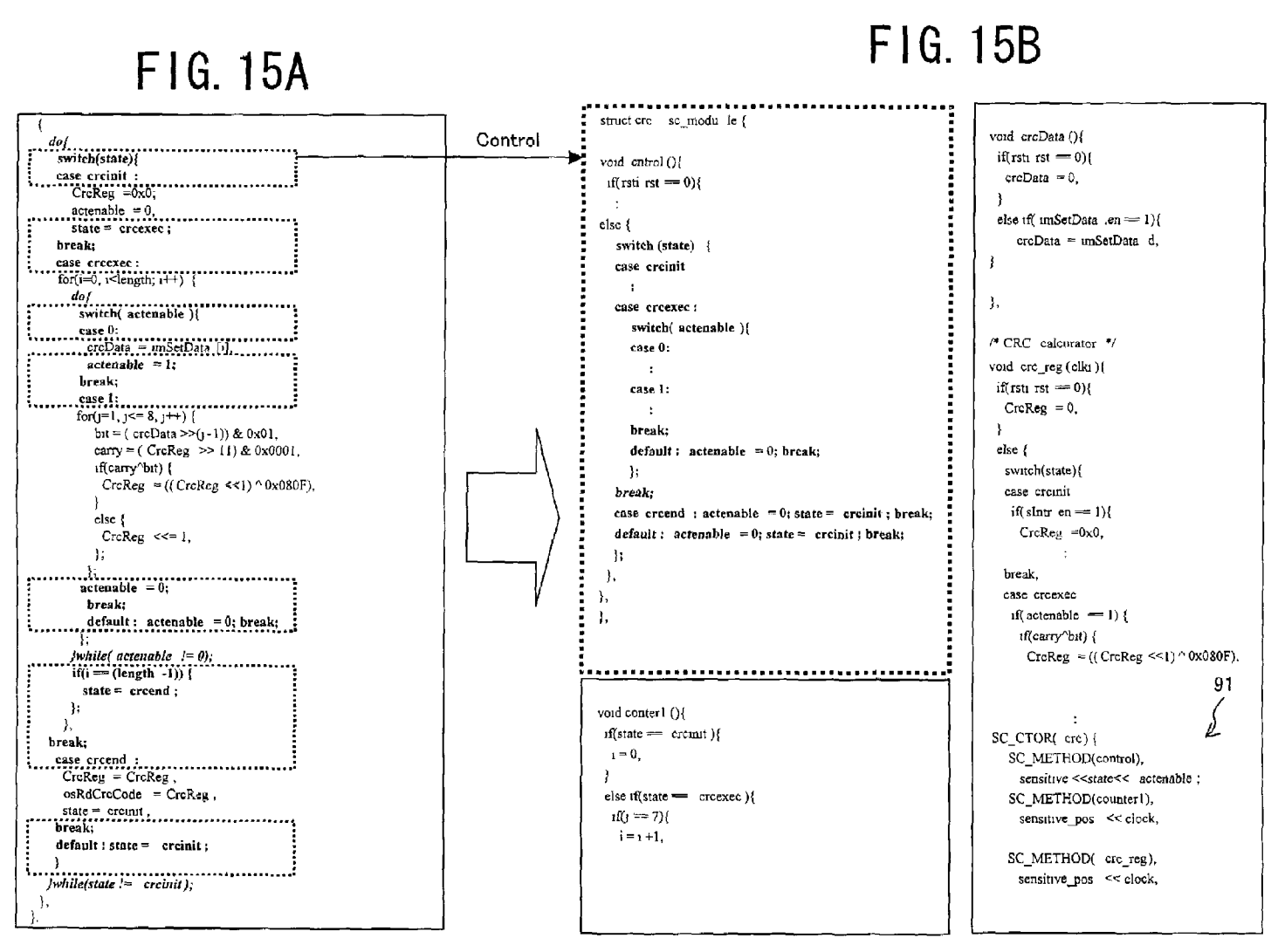

FIGS. 15A and 15B illustrate an example of conversion into the SystemC description 6, in which FIG. 15A illustrates the original functional C description and FIG. 15B illustrates a description converted into SystemC. The sensitive description denoted by 91 added to the end specifies whether the description is a part operating in clock synchronization or a part to be a combined circuit with a sensitive list.

After the conversion into the SystemC description 6 in the step S10, clock cycle base verification is performed using the SystemC simulator 54 of the SystemC verification system 50A in the SystemC verification step S11. When correct operation is confirmed in the clock cycle base verification, the SystemC description 6 is converted into the RTL HDL description 5 with the existing SystemC synthesis tool 70 such as a SystemC compiler in the SystemC-HDL conversion step S12.

As described above, in this embodiment, by the conversion from the functional C description into SystemC, for example, smooth conversion into a desired design language is possible. In this way, the design language can be determined after the verification of the hardware functions independent of the design language. Thus, since design can be started without the necessity of determining the design language, the simulation tool, the operation synthesis tool and the like at the start of development, the development efficiency greatly improves, and the time required for the development can be shortened. Also, optimal tools can be selected at the stage of completion of the functional C description.

In the above description, SystemC was exemplified. It is naturally possible to convert the functional C description into SpecC in a similar procedure by adopting SpecC grammar. In this case, also, a similar effect is provided.

In the above embodiments, the conversion into CoWareC, SystemC, SpecC or the like was performed at the RTLC stage. The step-by-step design method according to the present invention is also applicable to the following case. That is, a description in a module or block is written in a pure C language, but the module is connected to a module designed using any of the above system level description languages from the algorithm stage, and the connection is described according to the grammar of this system level description language. In such a case, also, the effect of improving the design efficiency is sufficiently obtained as in the above embodiments because the three main hardware components, that is, the data path, the control and the clock, are irrespective of the language.

The logic circuit design method of each embodiment of the present invention can be implemented by means of a computer executing a program for implementing the method. The method can also be implemented by recording a program for implementing the method on a computer-readable recording medium and allowing a computer to execute the program recorded on the recording medium. In particular, naturally, the functions of the algorithm-functional C conversion system 20 or 20A, the functional-RTLC conversion system 40 or 40A, and the functional-SystemC conversion system 40B can be implemented by means of a program.

As described above, according to the present invention, hardware of a logic circuit can be easily designed based on an algorithm C description written in an existing pure C language. The functional C description can be expressed to enable execution of one state in a plurality of cycles, and thus is suitable as a description style for examining the hardware architecture at a higher level of abstraction. Therefore, according to the present invention, the hardware architecture can be examined at a higher level of abstraction than that conventionally adopted.

The present invention can be easily implemented as a design automation (DA) tool. This can further reduce the time required for design.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

The above embodiment exemplifies CoWare C and System C. Wherein, it is needless to say that languages capable of describing conception of time (clock) can be applied to the present invention, as well.

What is claimed is:

1. A method of designing a logic circuit, comprising the steps of:

an algorithm C description outputting step for outputting an algorithm C description describing an algorithm of computation of the logic circuit or an algorithm of control of the logic circuit in a C language to an algorithm verification system for verifying the algorithm;

an algorithm-functional C conversion step for converting the algorithm C description into a functional C description describing control of hardware of the logic circuit in the C language by splitting the algorithm C description into the functional C description as units of processing;

a functional C description outputting step for outputting the functional C description to a function verification system for verifying functions of hardware or the logic circuit without considering the clock;

a functional-RTL C conversion step for converting the functional C description generated in the algorithm-functional C conversion step into a register transfer (RT) level C description written in the C language by inserting a clock description into the functional C description; and a RTLC-HDL conversion step for converting the RT level C description generated in the functional-RTLC conversion step into a RT level description in HDL, wherein the algorithm-functional C conversion step comprises the step of splitting the algorithm C description into at least a data input state corresponding to data input processing, a computation state corresponding to computation processing, and a result output state corresponding to data output processing.

2. The method of claim 1, wherein the algorithm-functional C conversion step comprises the step of splitting the algorithm C description into a plurality of states including at least one idle state or initializing state.

3. The method of claim 1, further comprising the step of:
a functional verification step for verifying functions of hardware of the logic circuit described in the functional C description excluding the clock,
wherein the functional-RTL C conversion step is processed when the functions of hardware are confirmed correct in the functional verification step.

4. The method of claim 1, further comprising the step of:
an operation verification step for verifying clock cycle timing operation of hardware described in the RT level C description,
wherein the RTLC-HDL conversion step is processed when the clock cycle timing operation is confirmed correct in the operation verification step.

5. The method of claim 1, wherein in the algorithm-functional C conversion step, the state transition is described in a "switch" sentence, each of the units of processing is described by multi-branch expression, the execution order is expressed by a transition destination in a "case" sentence.

6. The method of claim 5, wherein in the algorithm-functional C conversion step, when a plurality of processing items are executed in parallel in one state, each of a plurality of state machines is described so as to close itself by use of a loop expression.

7. The method of claim 1, further comprising the step of:
a module separation step for rewriting the algorithm C description according to modules taking notice of hardware functions to generate an algorithm C description for each module, said module separation step being preformed prior to said algorithm-functional C conversion step.

8. The method of claim 7, wherein in the module separation step, the algorithm C description is split into at least a memory part and a computation processing part.

9. The method of claim 7, wherein in the module separation step, an operator corresponding to a soft macro, which describes the function of hardware as software, or a hard macro, which describes the architecture of hardware, is separated from the algorithm C description as an individual module.

10. The method of claim 7, wherein in the module separation step, a parameter setting register part for setting a computation parameter described in the algorithm C description is separated from the algorithm C description as an individual module.

11. The method of claim 7, wherein in the module separation step, the algorithm C description is split into at least a control module and a data path module.

12. The method of claim 1, wherein in the functional-RTL C conversion step, a state transition description representing the control and a computation processing description representing the data path are extracted from the functional C description, and
a clock description is inserted in each of the extracted state transition description and computation processing description.

13. The method of claim 1, wherein in the functional-RTL C conversion step, the RT level C description is generated by adopting grammar of SystemC or SpecC.

14. A computer-readable recording medium including a recorded program, the program enabling a computer to execute the steps of:
an algorithm C description outputting step for outputting an algorithm C description describing an algorithm of computation of the logic circuit or an algorithm of control of the logic circuit in a C language to an algorithm verification system for verifying the algorithm;
an algorithm-functional C conversion step for converting the algorithm C description into a functional C description describing control of hardware of the logic circuit in the C language by splitting the algorithm C description into the functional C description as units of processing;
a functional C description outputting step for outputting the functional C description to a function verification system for verifying functions of hardware or the logic circuit without considering the clock; and
functional-RTL C conversion step for converting the functional C description generated in the algorithm-functional C conversion step into a register transfer (RT) level C description written in the C language by inserting a clock description into the functional C descriptions, wherein
the algorithm-functional C conversion step comprises the step of splitting the algorithm C description into at least a data input state corresponding to data input processing, a computation state corresponding to computation processing, and a result output state corresponding to data output processing.

15. A program prepared to enable a computer to execute the steps of:
an algorithm C description outputting step for outputting an algorithm C description describing an algorithm of computation of the logic circuit or an algorithm of control of the logic circuit in a C language to an algorithm verification system for verifying the algorithm;
an algorithm-functional C conversion step for converting the algorithm C description into a functional C description describing control of hardware of the logic circuit in the C language by splitting the algorithm C description into the functional C description as units of processing;
a functional C description outputting step for outputting the functional C description to a function verification system for verifying functions of hardware or the logic circuit without considering the clock; and
functional-RTL C conversion step for converting the functional C description generated in the algorithm-functional C conversion step into a register transfer (RT) level C description written in the C language by inserting a clock description into the functional C description, wherein
the algorithm-functional C conversion step comprises the step of splitting the algorithm C description into at least a data input state corresponding to data input processing, a computation state corresponding to computation processing, and a result output state corresponding to data output processing.

* * * * *